(12) United States Patent
Mouli

(10) Patent No.: US 7,439,594 B2
(45) Date of Patent: Oct. 21, 2008

(54) STACKED NON-VOLATILE MEMORY WITH SILICON CARBIDE-BASED AMORPHOUS SILICON THIN FILM TRANSISTORS

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 89 days.

(21) Appl. No.: 11/377,158

(22) Filed: Mar. 16, 2006

(65) Prior Publication Data

US 2007/0215954 A1 Sep. 20, 2007

(51) Int. Cl.
*H01L 27/108* (2006.01)
(52) U.S. Cl. .............................. 257/390; 257/E29.104; 257/E25.027; 257/E21.065; 257/E21.614
(58) Field of Classification Search .......... 257/E29.104, 257/E25.027, E21.065, E21.614
See application file for complete search history.

(56) References Cited

U.S. PATENT DOCUMENTS

| 5,888,857 | A | 3/1999 | Zhang et al. |
| 6,184,068 | B1 | 2/2001 | Ohtani et al. |
| 6,232,156 | B1 | 5/2001 | Ohtani et al. |
| 6,297,173 | B1 | 10/2001 | Tobin et al. |
| 6,674,138 | B1 | 1/2004 | Halliyal et al. |
| 6,806,125 | B2 | 10/2004 | Zhang et al. |
| 6,822,262 | B2 | 11/2004 | Yamazaki et al. |
| 6,841,813 | B2 * | 1/2005 | Walker et al. ............... 257/278 |
| 2003/0170930 | A1 * | 9/2003 | Choi et al. ..................... 438/99 |
| 2004/0207001 | A1 | 10/2004 | Kouznetsov et al. |
| 2005/0036382 | A1 | 2/2005 | Kato |
| 2005/0263767 | A1 | 12/2005 | Yamazaki et al. |
| 2005/0280001 | A1 * | 12/2005 | Chang .......................... 257/68 |
| 2006/0018164 | A1 * | 1/2006 | Wu ........................ 365/185.29 |
| 2006/0024868 | A1 * | 2/2006 | Herner ........................ 438/149 |
| 2006/0194379 | A1 * | 8/2006 | Suda et al. ................... 438/197 |
| 2006/0197141 | A1 * | 9/2006 | Ufert et al. .................. 257/315 |

FOREIGN PATENT DOCUMENTS

WO        WO 03/017285         2/2003

OTHER PUBLICATIONS

Chevaleevski, Oleg et al, "ESR Studies of Hydrogenated Nanocrystalline Silicon Carbide." 3rd World Conference on Photovoltaic Energy Conversion, pp. 1859-1862. May 11-18, 2003.*
Cheng, Kuo-Liang et al. "RAMSES-FT: A Fault Simulator for Flash Memory Testing and Diagnostics." Proceedings of the 20th IEEE VLSI Test Symposium. 2002.*

* cited by examiner

*Primary Examiner*—Anh D. Mai
*Assistant Examiner*—Christopher M Roland
(74) *Attorney, Agent, or Firm*—Leffert Jay & Polglaze, P.A.

(57) ABSTRACT

A stacked non-volatile memory device uses amorphous silicon based thin film transistors stacked vertically. Each layer of transistors or cells is formed from a deposited a-Si channel region layer having a predetermined concentration of carbon to form a carbon rich silicon film or silicon carbide film, depending on the carbon content. The dielectric stack is formed over the channel region layer. In one embodiment, the dielectric stack is an ONO structure. The control gate is formed over the dielectric stack. This structure is repeated vertically to form the stacked structure. In one embodiment, the carbon content of the channel region layer is reduced for each subsequently formed layer.

17 Claims, 5 Drawing Sheets

STACKED NON-VOLATILE MEMORY WITH SILICON CARBIDE-BASED AMORPHOUS SILICON THIN FILM TRANSISTORS

TECHNICAL FIELD OF THE INVENTION

The present invention relates generally to memory devices and in particular the present invention relates to non-volatile memory device architecture.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The performance of flash memory devices needs to increase as the performance of computer systems increase. For example, a flash memory transistor that can be erased faster with lower voltages and have longer retention times could increase system performance.

Amorphous silicon (a-Si)-based thin film transistors (TFT) have been used to improve transistor performance. However, these transistors have undesirable short channel effects and randomness in device characteristics. This is largely due to the randomness in polysilicon grain size and grain boundaries that exist in TFT devices. For example, in sub-75 nm feature sizes, this can result in a very large variation in device characteristics making the stacked cell approach extremely challenging for mass manufacture.

Silicon carbide (SiC) substrates have been used in power devices due to the higher bandgap over silicon. Wide bandgap material like SiC substrates have very low intrinsic carrier concentration and thermal generation scales directly with the intrinsic carrier concentration. Therefore, junction leakage currents in SiC substrate devices are very low.

However, SiC substrates suffer numerous problems. For example, wafer sizes in excess of four inches that have high quality and low cost are difficult to achieve. Additionally, the defect densities are unacceptable and the substrates suffer from poor carrier mobility for high speed switching.

For the reasons stated above, and for other reasons stated below which will become apparent to those skilled in the art upon reading and understanding the present specification, there is a need in the art for a higher performance flash memory transistor that does not have serious scaling issues.

SUMMARY

The above-mentioned problems with non-volatile memory performance and other problems are addressed by the present invention and will be understood by reading and studying the following specification.

The present invention encompasses a stacked non-volatile thin film memory device having a memory array comprising a plurality of layers of stacked, thin film memory cells stacked vertically on a substrate. Each memory cell comprises an insulation layer formed over the substrate. A channel region layer is formed over the insulation layer. The channel region layer is comprised of amorphous silicon layer that has a predetermined concentration of carbon. A dielectric stack is formed over the channel region layer. A control gate is formed over the dielectric stack.

Further embodiments of the invention include methods and apparatus of varying scope.

DETAILED DESCRIPTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer and substrate used previously and in the following description include any base semiconductor structure. Both are to be understood as including bulk silicon, silicon-on-sapphire (SOS) technology, silicon-on-insulator (SOI) technology, silicon-on-nothing, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the claims and equivalents thereof.

Figure 1:
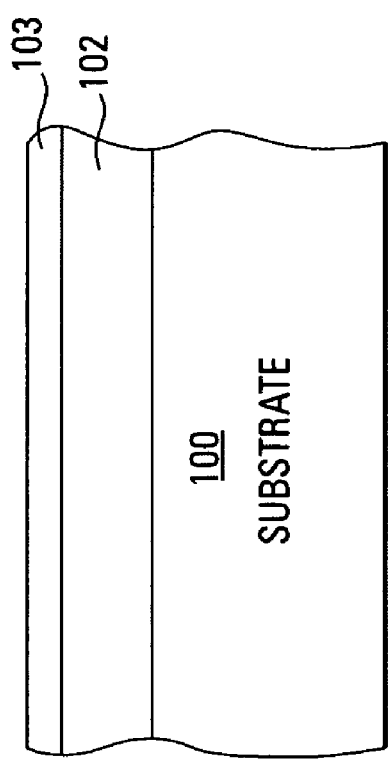
FIG. 1 shows a cross-sectional view of one embodiment of one or more steps in a method for fabrication of a memory device of the present invention.

FIG. 1 illustrates a cross-sectional view of one embodiment of one or more steps for fabricating a memory device of the present invention. A substrate 100 undergoes standard CMOS processing for substrate isolation, well implants, and, if needed, threshold voltage adjustments. All periphery logic devices are preferably formed in starting silicon substrate—bulk or SOI.

In one embodiment, the substrate 100 is a p-type substrate with n-wells having p-type regions. Alternate embodiments may use other conductivity types.

The periphery regions are covered and hard mask and lithography steps used to open up the memory array. An insulation layer 102 is formed over the substrate/well 100.

In one embodiment, this is an oxide layer 102. Alternate embodiments may use other insulating materials for the insulation layer 102.

A silicon carbide (SiC) and/or carbon rich amorphous silicon (a-Si) layer 103 is formed over the insulation layer 102. This film 103 forms the channel region of the memory transistors of the present invention. The carbon concentration in the film 103 is tuned by controlling the Si:C growth temperature. In an alternate embodiment, the SiC thin film is formed by direct deposition to form the channel region. In yet another embodiment, the Si:C is formed after the a-Si deposition.

In still another alternate embodiment, the Si:C is formed on silicon-germanium (a-SiGe) after deposition. In one version of this embodiment, the mole fraction of SiGe is tuned along with the Si:C content to optimize carrier mobility.

In yet another embodiment, the Si:C thin film is formed on hydrogenated a-Si (a-Si:H). Another embodiment forms the Si:C thin film on deteuritated a-Si (a-Si:D) and/or fluorinated a-Si (a-Si:F).

In one embodiment, an optional thin a-Si cap layer (not shown) is deposited on the SiC layer 103. The a-Si cap layer can act as a seed for gate oxidation. In another embodiment, this layer may be an oxide layer formed by an atomic layer deposition (ALD) process.

Figure 2:
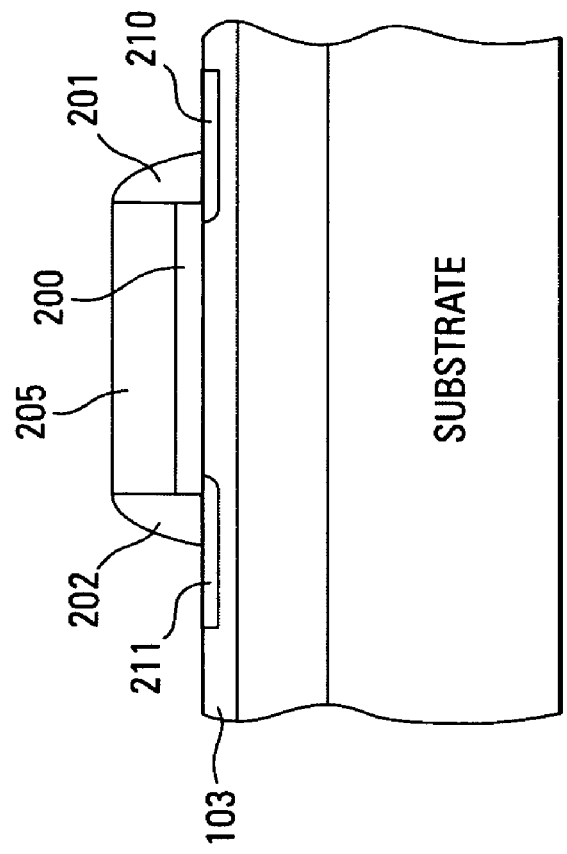
FIG. 2 shows a cross-sectional view of one embodiment of one or more steps in the method for fabrication of the memory device of the present invention.

FIG. 2 illustrates additional fabrication steps of the present invention. This figure shows that the oxide-nitride-oxide (ONO) dielectric stack 200 for each transistor is formed over the SiC channel region layer 103. The ONO dielectric stack 200 is formed for conventional SONOS memory cells. The nitride layer of the ONO dielectric 200 is the charge storage layer or floating gate.

Alternate embodiments may use other dielectric stacks depending on the desired cell characteristics. For example, $Al_2O_3$, $HfO_2$, $LaO_3$, $LaAlO_3$, and other suitable high dielectric constant (high-k) materials can be substituted for the nitride film. In another embodiment, the dielectric stack may have a graded stoichiometry, forming a "crested barrier" structure.

A control gate 205 is formed over the ONO stack 200. The gate 205 can be polysilicon, metal, or some other suitable gate material. In one embodiment, the gate 205 is a p+ poly. Alternate embodiments may use n+ poly. A metal gate 205 can include metals such as TiN, TaN or some other suitable metal.

The spacers 201, 202 are formed adjacent the transistor stack 200, 205. In one embodiment, the spacers 201, 202 are an oxide. Alternate embodiments can use other materials.

Source and drain regions 210, 211 are formed in the channel region layer 103. In one embodiment, these are n+ doped regions in the SiC layer 103. An alternate embodiment can use p+ regions. The source/drain regions 210, 211 can be formed by conventional implants, solid-source diffusion, plasma doping schemes, or some other suitable method. In another embodiment, the source/drain regions 210, 211 are formed utilizing gate-induced tunneling through Schottky barriers. In such devices, carrier injection is controlled by the modulation of the Schottky barrier width within a fully depleted source extension region.

In an alternate embodiment, the source/drain region implants are eliminated by forming source/drain contacts to the Si:C thin film using metals and/or silicides with suitable work function to form low Schottky barrier contacts.

The function of each source/drain region 210, 211 is determined by the biasing of the transistor. For example, a first region 210 may act like a drain region 210 when it is biased with a positive voltage and the remaining region 211 is a source region when it is at ground potential or left floating. An alternate embodiment can bias these regions 210, 211 such that the functions reverse. During transistor operation, a channel forms in the channel region layer 103 between the source/drain regions 210, 211.

Metal deposition and pattern steps can be used to form Schottky contacts for the source/drain regions 210, 211. The contacts could be used to gain access to these regions 210, 211, for example, if they were formed on the top layer of a multiple transistor stack and required contact to interface with external connections and/or other circuits of the integrated circuit.

Figure 3:
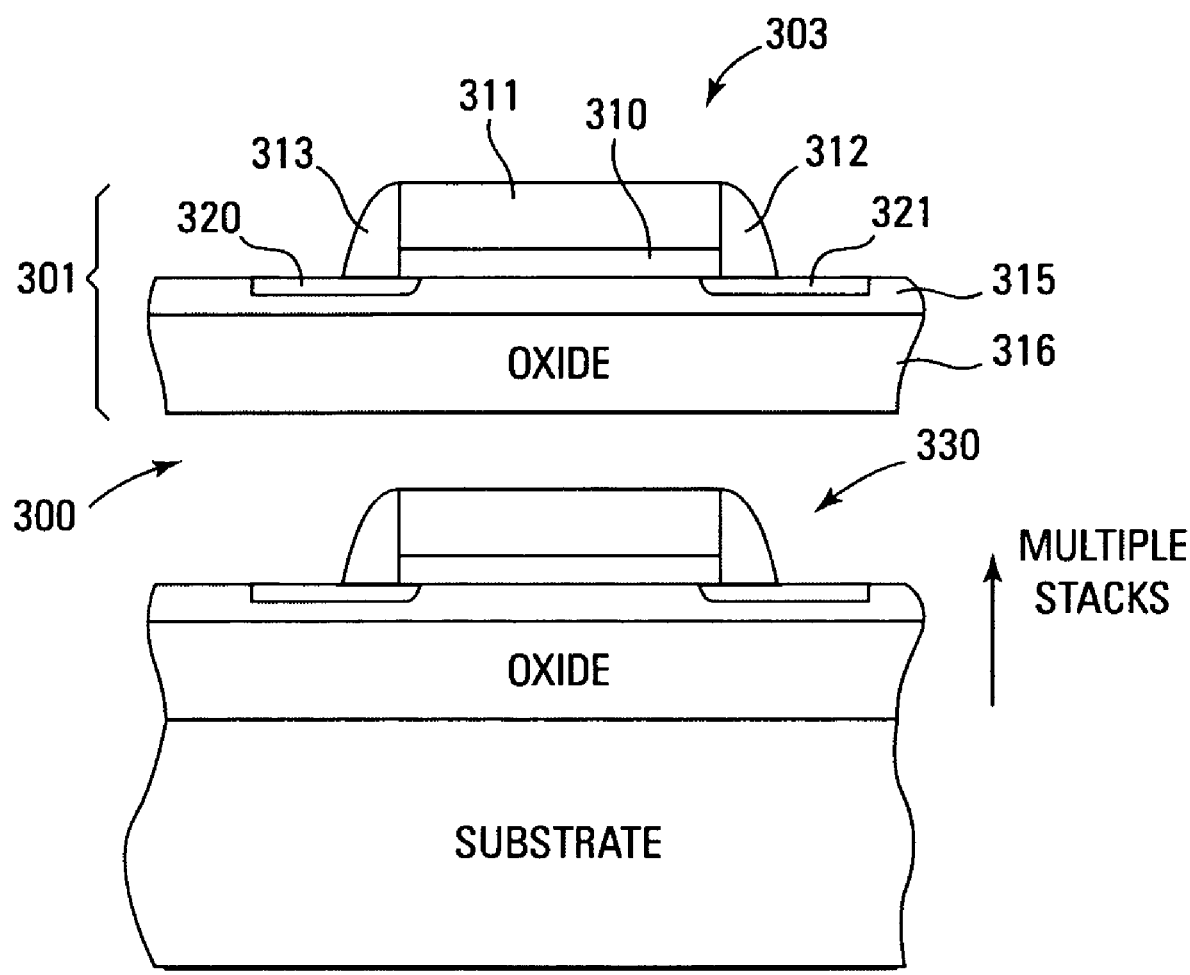
FIG. 3 shows a cross-sectional view of one embodiment of one or more steps in the method for fabrication of the memory device of the present invention.

FIG. 3 illustrates another set of steps in fabricating the stacked non-volatile memory cells of the present invention. An oxide or other spacer material 300 is formed over the just completed transistor from FIG. 2. An oxide or other insulating layer 316 is then formed over this and the above described process is repeated for as many transistor stacks as desired.

The illustrated embodiment includes forming the second transistor 301 over the transistor of FIG. 2. The second transistor stack is comprised of the SiC or carbon rich silicon layer 315 over the oxide layer 316. The source/drain regions 320, 321 formed in the SiC channel region layer 315. The transistor stack 303 comprising the ONO layer 310 and the control gate 311 is formed over the channel region layer 315 and the spacer material 312, 313 is formed on either side of the transistor stack 303.

In one embodiment, the carbon concentration is decreased in each subsequently formed transistor layer. In other words, the lowest transistor layer 330 will experience the greatest thermal budget. Therefore, the lowest layer 330 will have the greatest carbon content. The next layer of transistors 301 will experience somewhat less thermal processing and, thus, has less carbon concentration than the lower layer. The decrease in carbon content continues for each subsequently formed transistor layer. The carbon content can be tailored by changing the interstitial carbon concentration during Si:C growth. Such an embodiment provides a first channel layer with superior short channel effects at the cost of a slight mobility reduction.

One embodiment of the above described stacked memory transistors uses 4H—SiC in the SiC layer 103. 4H SiC has a band gap energy of 3.26 eV, thermal conductivity of 3.0-3.8 W/cm K at 300K and a breakdown electric field of $2.2 \times 10^6$ V/cm. Another embodiment uses 6H—SiC that has a band gap energy of 3.03 eV, thermal conductivity of 3.0-3.8 W/cm K at 300K and a breakdown electric field of $2.4 \times 10^6$ V/cm. These properties make it clear that SiC is an excellent material compared to silicon due to its very low leakage, high temperature operating characteristics, sustaining high electric fields, and excellent heat dissipation.

Figure 4:
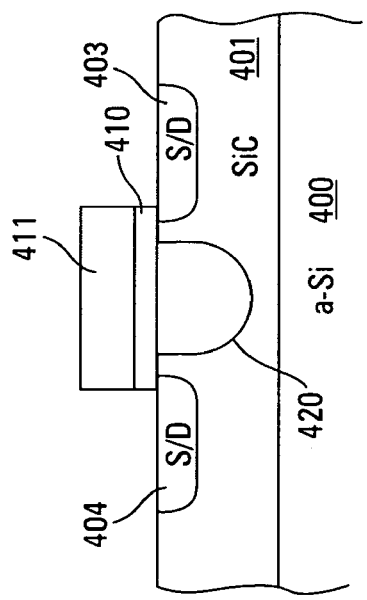
FIG. 4 shows a cross-sectional view of one embodiment of a three dimensional transistor of the present invention.

FIG. 4 illustrates a cross-sectional view of one embodiment of a three dimensional transistor in accordance with the thin film channel region layer of the present invention. The transistor is fabricated on an a-Si 400 layer on the substrate. The channel region 420 between the source/drain regions 403, 404 is a U-shaped region 420 that is formed in a thin layer of carbon rich silicon (Si:C). In an alternate embodiment, SiC may be used for the channel region layer 401.

The ONO dielectric stack 410 fills the U-shaped area. A poly or metal gate 411 is formed over the ONO dielectric. As in previous embodiments, the nitride layer of the ONO stack 410 acts as the floating gate or charge storage layer.

The fabrication of the embodiment of FIG. 4 can be repeated multiple times to form a transistor stack of such non-planar transistors. This process has been discussed previously. The various alternate embodiments in fabrication and materials discussed previously can also be employed in these non-planar transistors.

Figure 6:
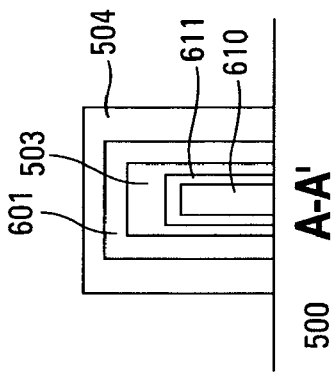
FIG. 6 shows a cross-sectional view of the embodiment of FIG. 5.

FIG. 6 illustrates another non-planar embodiment of the present invention. This embodiment is a FinFET memory cell that employs the SiC/Si:C thin film channel region layer of the present invention.

The FinFET embodiment is comprised of a substrate 500 that, in one embodiment, is comprised of silicon. Two source/drain regions 501, 502 are formed in a three dimensional manner over the substrate 500. A silicon "fin" 503 is formed between the source/drain regions 501, 502. A gate 504 is formed over the silicon "fin" 503. The gate can be a poly or metal gate. The gate is shown in dotted lines for purposes of clarity.

The "fin" 503 contains the Si:C/SiC channel region of the present invention. The structure of the "fin" 503 is shown in FIG. 6 and described subsequently. The percentage of carbon added to the amorphous silicon decreases for each subsequently formed layer of vertically stacked FinFET memory cells.

Figure 5:
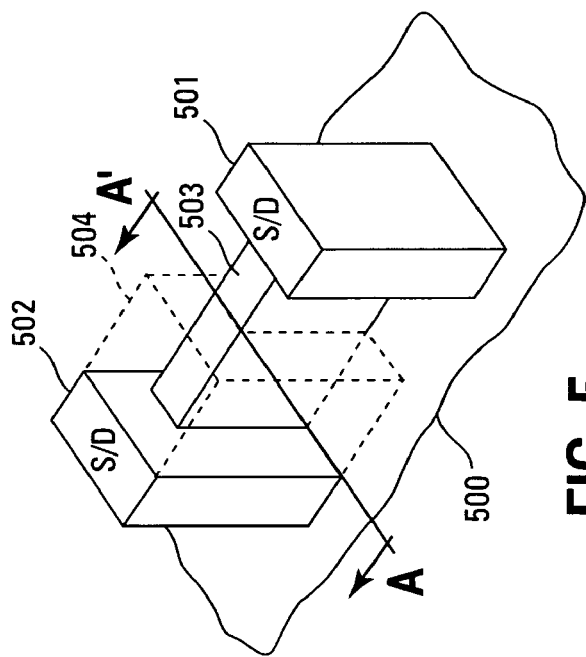
FIG. 5 shows a perspective view of a FinFET embodiment of the present invention.

The FinFET of FIG. 5 is a double or triple gate transistor. The transistor is a double gate if the gate oxide (601 of FIG. 6) between the gate 504 and the "fin" is greater on the sidewalls of the "fin" than the top. The transistor is a triple gate structure if the gate oxide is the same thickness on all three surfaces.

FIG. 6 shows a cross-sectional view, along axis A-A', of the FinFET embodiment of FIG. 5. This view shows the substrate 500 over which the channel region 610, the ONO layer 611, and the Si:C or SiC thin film layer 503 is formed as shown in the three dimensional view of FIG. 5.

This view additionally shows the gate oxide layer 601 that is formed over the "fin". While FIG. 6 shows this layer 601 to be of equal thickness over each surface, as would be the case in a triple gate structure, alternate embodiments can vary the thickness as previously described. For example, for a double gate device, the top surface of the "fin" would not be as thick as the sidewalls.

The gate 504 is formed over the gate oxide layer 601. The gate 504 can be comprised of polysilicon, metal, or some other suitable gate material.

The fabrication of the embodiment of FIGS. 5 and 6 can be repeated multiple times to form a three dimensional transistor stack, as illustrated in the embodiment of FIG. 3, of such non-planar transistors. This process has been discussed previously. The various alternate embodiments in fabrication and materials discussed previously can also be employed in these non-planar transistors.

Figure 7:
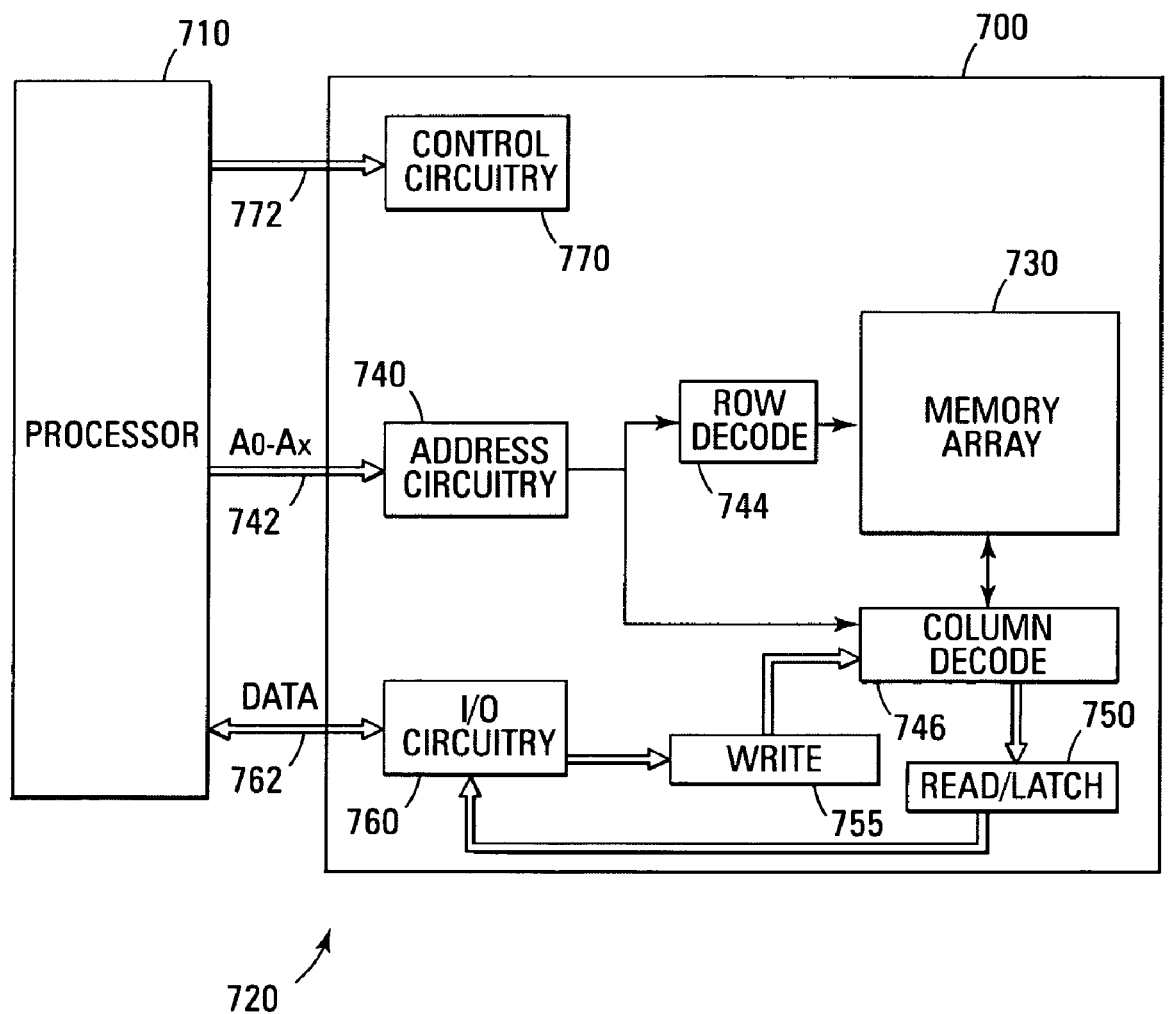
FIG. 7 shows a block diagram of an electronic memory system of the present invention.

FIG. 7 illustrates a functional block diagram of a memory device 700 that can incorporate the stacked non-volatile memory cells of the present invention. The memory device 700 is coupled to a processor 710. The processor 710 may be a microprocessor or some other type of controlling circuitry. The memory device 700 and the processor 710 form part of an electronic memory system 720. The memory device 700 has been simplified to focus on features of the memory that are helpful in understanding the present invention.

The memory device includes an array of non-volatile memory cells 730 that can be floating gate flash memory cells. The memory array 730 is arranged in banks of rows and columns. The control gates of each row of memory cells is coupled with a word line while the drain regions of the memory cells are coupled to bit lines. The source regions of the memory cells are coupled to source lines. As is well known in the art, the connection of the cells to the bit lines and source lines depends on whether the array is a NAND architecture, a NOR architecture, an AND architecture or some other memory array architecture. The stacked non-volatile memory cells of the present invention can operate in any memory array architecture.

An address buffer circuit 740 is provided to latch address signals provided on address input connections A0-Ax 742. Address signals are received and decoded by a row decoder 744 and a column decoder 746 to access the memory array 730. It will be appreciated by those skilled in the art, with the benefit of the present description, that the number of address input connections depends on the density and architecture of the memory array 730. That is, the number of addresses increases with both increased memory cell counts and increased bank and block counts.

The memory integrated circuit 700 reads data in the memory array 730 by sensing voltage or current changes in the memory array columns using sense/buffer circuitry 750. The sense/buffer circuitry, in one embodiment, is coupled to read and latch a row of data from the memory array 730. Data input and output buffer circuitry 760 is included for bi-directional data communication over a plurality of data connections 762 with the controller 710. Write circuitry 755 is provided to write data to the memory array.

Control circuitry 770 decodes signals provided on control connections 772 from the processor 710. These signals are used to control the operations on the memory array 730, including data read, data write, and erase operations. The control circuitry 770 may be a state machine, a sequencer, or some other type of controller.

The non-volatile memory device illustrated in FIG. 7 has been simplified to facilitate a basic understanding of the features of the memory. A more detailed understanding of internal circuitry and functions of flash memories are known to those skilled in the art.

Figure 8:
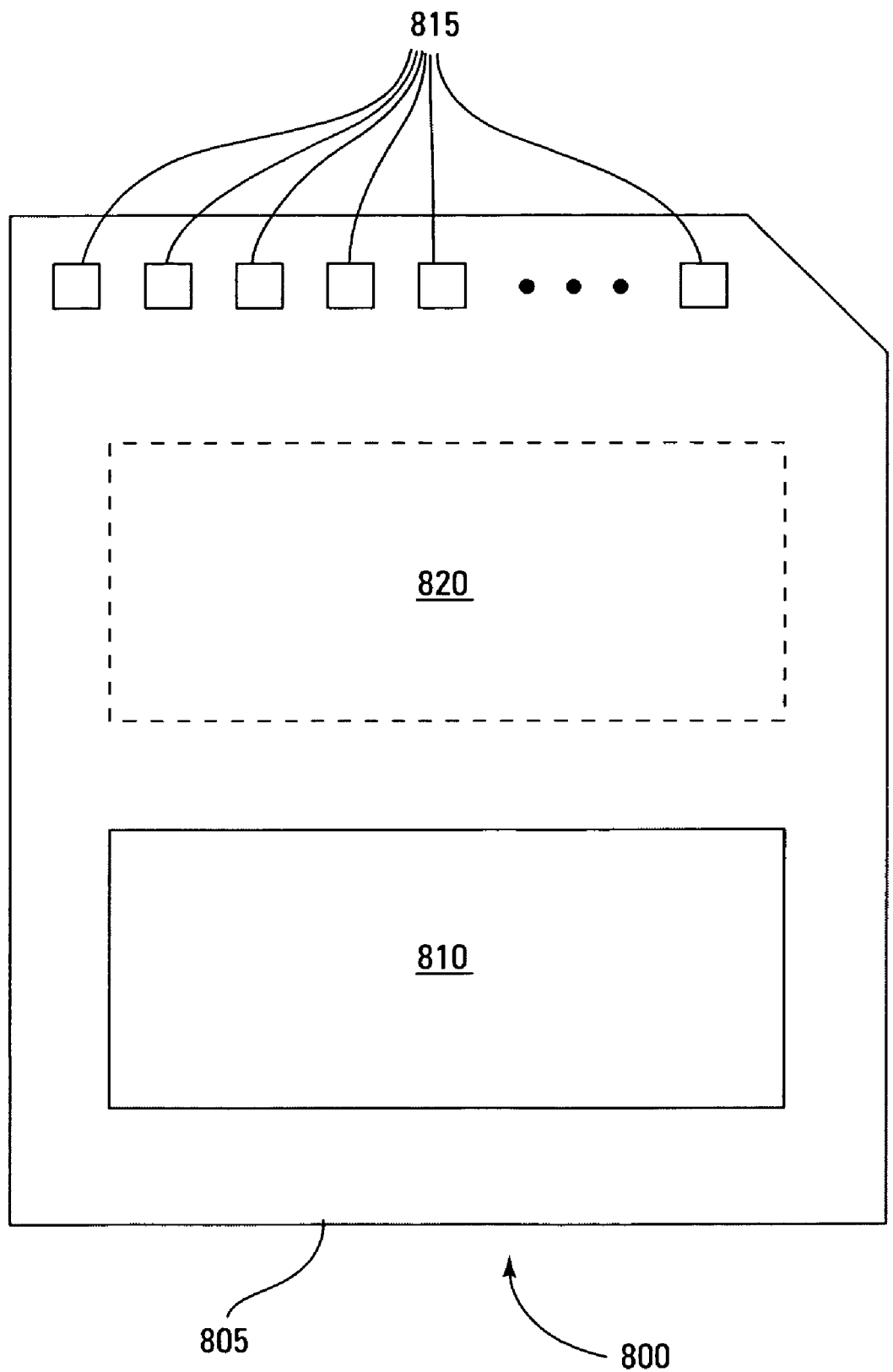
FIG. 8 shows a block diagram of one embodiment of a memory module of the present invention.

FIG. 8 is an illustration of an exemplary memory module 800. Memory module 800 is illustrated as a memory card, although the concepts discussed with reference to memory module 800 are applicable to other types of removable or portable memory, e.g., USB flash drives, and are intended to be within the scope of "memory module" as used herein. In addition, although one example form factor is depicted in FIG. 8, these concepts are applicable to other form factors as well.

In some embodiments, memory module 800 will include a housing 805 (as depicted) to enclose one or more memory devices 810, though such a housing is not essential to all devices or device applications. At least one memory device 810 is a non-volatile memory [including or adapted to perform elements of the invention]. Where present, the housing 805 includes one or more contacts 815 for communication with a host device. Examples of host devices include digital cameras, digital recording and playback devices, PDAs, personal computers, memory card readers, interface hubs and the like. For some embodiments, the contacts 815 are in the form of a standardized interface. For example, with a USB flash drive, the contacts 815 might be in the form of a USB Type-A male connector. For some embodiments, the contacts 815 are in the form of a semi-proprietary interface, such as might be found on COMPACTFLASH memory cards licensed by SANDISK Corporation, MEMORYSTICK memory cards licensed by SONY Corporation, SD SECURE DIGITAL memory cards licensed by TOSHIBA Corporation and the like. In general, however, contacts 815 provide an interface for passing control, address and/or data signals between the memory module 800 and a host having compatible receptors for the contacts 815.

The memory module 800 may optionally include additional circuitry 820 which may be one or more integrated circuits and/or discrete components. For some embodiments, the additional circuitry 820 may include a memory controller for controlling access across multiple memory devices 810 and/or for providing a translation layer between an external host and a memory device 810. For example, there may not be a one-to-one correspondence between the number of contacts 815 and a number of I/O connections to the one or more memory devices 810. Thus, a memory controller could selectively couple an I/O connection (not shown in FIG. 8) of a memory device 810 to receive the appropriate signal at the appropriate I/O connection at the appropriate time or to provide the appropriate signal at the appropriate contact 815 at the appropriate time. Similarly, the communication protocol between a host and the memory module 800 may be different than what is required for access of a memory device 810. A memory controller could then translate the command sequences received from a host into the appropriate command sequences to achieve the desired access to the memory device 810. Such translation may further include changes in signal voltage levels in addition to command sequences.

The additional circuitry 820 may further include functionality unrelated to control of a memory device 810 such as logic functions as might be performed by an ASIC (application specific integrated circuit). Also, the additional circuitry 820 may include circuitry to restrict read or write access to the memory module 800, such as password protection, biometrics or the like. The additional circuitry 820 may include circuitry to indicate a status of the memory module 800. For example, the additional circuitry 820 may include functionality to determine whether power is being supplied to the memory module 800 and whether the memory module 800 is currently being accessed, and to display an indication of its status, such as a solid light while powered and a flashing light while being accessed. The additional circuitry 820 may further include passive devices, such as decoupling capacitors to help regulate power requirements within the memory module 800.

CONCLUSION

In summary, the non-volatile memory transistors of the present invention are fabricated on a silicon carbide or carbon rich silicon channel thin film. This provides reduced tunnel barrier and ease of erase with lower voltages and electric fields. The cells of the present invention are stackable in order to greatly increase the density of a memory device.

The non-volatile memory cells of the present invention may be NAND-type cells, NOR-type cells, or any other type of non-volatile memory array architecture.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A stacked non-volatile thin film memory device comprising:
   a plurality of thin film memory cells stacked vertically on a substrate, each memory cell comprising:
      an insulation layer formed on and in contact with the substrate;
      a channel region layer formed on and in contact with the insulation layer, the channel region layer comprising amorphous silicon layer having a predetermined concentration of carbon, a air of source/drain regions formed in the channel region layer;
      a dielectric stack formed on and in contact with the channel region layer between the pair of source/drain regions, wherein the dielectric stack is comprised of a charge storage layer; and
      a control gate formed on and in contact with the dielectric stack;
      wherein the predetermined concentration of carbon decreases in increasing layers of thin film memory cells.

2. The device of claim 1 wherein the control gate is comprised of one of polysilicon or metal.

3. The device of claim 2 wherein the metal is one of TiN or TaN.

4. The device of claim 1 wherein the insulation layer is an oxide layer.

5. The device of claim 1 and further including an insulation material formed vertically between each memory cell.

6. The device of claim 1 wherein the predetermined concentration of carbon is such that the amorphous silicon layer is a silicon carbide layer.

7. A stacked non-volatile thin film memory device comprising:
   a plurality of thin film memory cells stacked vertically on a silicon substrate, each memory cell layer comprising:
      an oxide layer formed on and in contact with the substrate;
      an amorphous silicon layer formed on and in contact with the oxide layer and having a predetermined concentration of carbon;
      a dielectric stack formed on and in contact with the amorphous silicon layer, wherein the dielectric stack is comprised of a floating gate charge storage layer between two insulating layers;
      a pair of source/drain regions formed in the amorphous silicon layer on opposing sides of the dielectric stack; and
      a control gate formed on and in contact with the dielectric stack;
      wherein the predetermined concentration of carbon decreases in increasing layers of thin film memory cells.

8. The device of claim 7 wherein the non-volatile thin film memory device is a flash memory device.

9. The device of claim 7 wherein the dielectric stack comprises an oxide-nitride-oxide structure.

10. The device of claim 7 and further including spacer material formed on opposing sides of the dielectric stack.

11. The device of claim 7 and further including a metal contact formed on each source/drain region in a top layer of the plurality of stack memory cells.

12. An memory system comprising:
   a processor that generates control signals; and a memory device coupled to the processor, the device having a memory array comprising a plurality of layers of thin film memory cells formed over a substrate, each layer comprising:
- an insulation layer formed on and in contact with the substrate;
- a channel region layer formed on and in contact with the insulation layer, the channel region layer comprising an amorphous silicon layer having a predetermined concentration of carbon, the channel region layer further comprising a pair of source/drain regions;
- a dielectric stack formed on and in contact with the channel region layer between the pair of source/drain regions, the dielectric stack comprising an oxide-nitride-oxide structure; and
- a control gate formed on and in contact with the dielectric stack;
- wherein the predetermined concentration of carbon decreases for each subsequently formed layer of thin film memory cells.

13. The system of claim 12 wherein the memory array is comprised of a NAND-type architecture.

14. The system of claim 12 wherein the memory array is comprised of a NOR-type architecture.

15. A memory module comprising:
at least two memory devices, each comprising a memory array having a plurality of layers of thin film memory cells formed on and in contact with a substrate, each layer comprising:
- an insulation layer formed on and in contact with the substrate;
- a channel region layer formed on and in contact with the insulation layer, the channel region layer comprising an amorphous silicon layer having a predetermined concentration of carbon and a pair of source/drain regions, wherein the predetermined concentration of carbon decreases for increasing layers of thin film memory cells;
- a dielectric stack formed on and in contact with the channel region layer between the pair of source/drain regions, the dielectric stack comprising a floating gate layer for charge storage; and
- a control gate formed on and in contact with the dielectric stack; and
a plurality of contacts configured to provide selective contact between the memory array and a host system.

16. The module of claim 15 and further including a memory controller coupled to the memory array for controlling operation of the memory device in response to the host system.

17. A memory module comprising:
a memory device comprising a memory array having a plurality of layers of thin film memory cells formed over a substrate, each layer comprising:
- an insulation layer formed on and in contact with the substrate;
- a channel region layer formed on and in contact with the insulation layer, the channel region layer comprising an amorphous silicon layer having a predetermined concentration of carbon and a pair of source/drain regions, wherein the predetermined concentration of carbon decreases for increasing layers of thin film memory cells;
- a dielectric stack formed on and in contact with the channel region layer between the pair of source/drain regions, the dielectric stack comprising a floating gate layer for charge storage; and
- a control gate formed on and in contact with the dielectric stack; and
a housing for enclosing the memory device; and
a plurality of contacts coupled to the housing and configured to provide selective contact between the memory array and a host system.

* * * * *

UNITED STATES PATENT AND TRADEMARK OFFICE
CERTIFICATE OF CORRECTION

PATENT NO. : 7,439,594 B2  Page 1 of 1
APPLICATION NO. : 11/377158
DATED : October 21, 2008
INVENTOR(S) : Mouli It is certified that error appears in the above-identified patent and that said Letters Patent is hereby corrected as shown below:

In column 8, line 12, in Claim 1, delete "air" and insert -- pair --, therefor.

Signed and Sealed this

Thirteenth Day of January, 2009

JON W. DUDAS
*Director of the United States Patent and Trademark Office*